US012733420B2

(12) United States Patent
Yong et al.

(10) Patent No.: US 12,733,420 B2
(45) Date of Patent: Sep. 8, 2026

(54) METHODS OF SELECTIVELY ETCHING SILICON NITRIDE

(71) Applicant: Applied Materials, Inc., Santa Clara, CA (US)

(72) Inventors: Doreen Wei Ying Yong, Singapore (SG); Tuck Foong Koh, Singapore (SG); John Sudijono, Singapore (SG); Mikhail Korolik, San Jose, CA (US); Paul E. Gee, San Jose, CA (US); Thai Cheng Chua, Cupertino, CA (US); Philip A. Kraus, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 298 days.

(21) Appl. No.: 18/210,918

(22) Filed: Jun. 16, 2023

(65) Prior Publication Data

US 2024/0420962 A1 Dec. 19, 2024

(51) Int. Cl.
*H10P 50/28* (2026.01)
*H01J 37/32* (2006.01)

(52) U.S. Cl.
CPC ...... *H10P 50/283* (2026.01); *H01J 37/32192* (2013.01); *H01J 37/32816* (2013.01); *H01J 2237/182* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 2016/0064233 A1 | 3/2016 | Wang et al. | |
| 2018/0286707 A1 | 10/2018 | Hudson et al. | |
| 2019/0206697 A1 | 7/2019 | Eason et al. | |
| 2020/0043744 A1* | 2/2020 | Ito | H01L 21/67069 |
| 2020/0098586 A1 | 3/2020 | Xia et al. | |
| 2020/0321218 A1 | 10/2020 | Zhang et al. | |
| 2021/0005472 A1 | 1/2021 | Kanarik et al. | |

(Continued)

FOREIGN PATENT DOCUMENTS

| | | |
|---|---|---|
| KR | 20210015739 A | 2/2021 |
| WO | 2018195426 A1 | 10/2018 |

OTHER PUBLICATIONS

U.S. Appl. No. 17/903,913, filed Sep. 6, 2022, 50 pages.

(Continued)

*Primary Examiner* — Roberts P Culbert
(74) *Attorney, Agent, or Firm* — SERVILLA WHITNEY LLC

(57) ABSTRACT

Embodiments of the present disclosure are directed to selective etching processes. The processes include an etching chemistry (a plasma of a fluorine-containing precursor and a first gas mixture), and a passivating chemistry (a plasma of a sulfur-containing precursor and a second gas mixture). In some embodiments, the sulfur-containing precursor and the second gas mixture are present in a ratio of sulfur-containing precursor to second gas mixture in a range of from 0.01 to 5. The methods include etching a substrate having a plurality of alternating layers of silicon oxide and silicon nitride thereon and a trench formed through the plurality of alternating layers. The silicon nitride layers are selectively etched relative to the silicon oxide layers at an etch selectivity of greater than or equal to 500:1.

20 Claims, 3 Drawing Sheets

(56) References Cited

U.S. PATENT DOCUMENTS

| | | | |
|---|---|---|---|
| 2021/0082709 | A1 | 3/2021 | Tomura et al. |
| 2021/0111033 | A1 | 4/2021 | Korolik et al. |
| 2022/0216062 | A1 | 7/2022 | Matsui |
| 2022/0246436 | A1 | 8/2022 | Wang et al. |
| 2022/0254645 | A1 | 8/2022 | Luan et al. |
| 2022/0293430 | A1 | 9/2022 | Korolik et al. |
| 2023/0109912 | A1 | 4/2023 | Chua et al. |
| 2024/0420962 | A1 | 12/2024 | Yong et al. |

OTHER PUBLICATIONS

Jackman, R.B. , et al., "Semiconductor Surface Etoiing by Halogens: Fundamental Steps R.", Applied Surface Science 36 (1989) 296-312 North-Holland, Amsterdam.
Nakane, Kazuya , et al., "In situ monitoring of surface reactions during atomic layer etching of silicon nitride using hydrogen plasma and fluorine radicals".
Rai-Choudhury, P. , "Hydrogen Sulfide as an Etchant for Silicon", 1969 J. Electrochem. Soc. 116 539.
Shih, Minliang , et al., "Decomposition of SF6 and H2S Mixture in Radio Frequency Plasma Environment", Ind. Eng. Chem. Res. 2003, 42, 2906-2912.
Wikipedia Hydrogen Sulfide via https://en.wikipedia.org/wiki/Hydrogen_sulfide (Year: 2025).
Wikipedia, "Sufanyl" via https://en.wikipedia.org/wiki/Sulfanyl (Year: 2025).
"PCT International Search Report and Written Opinion in PCT/US2024/034005 dated Oct. 4, 2024, 10 pages".
"PCT International Search Report and Written Opinion in PCT/US2024/037975 dated Oct. 31, 2024, 10 pages".
Final Office Action in U.S. Appl. No. 18/223,382 dated Nov. 3, 2025, 18 pages.
Machine Translation of KR20210015739A.

* cited by examiner

METHODS OF SELECTIVELY ETCHING SILICON NITRIDE

TECHNICAL FIELD

Embodiments of the present disclosure relate to the field of semiconductor manufacturing. More particularly, embodiments of the disclosure relate to selectively etching silicon nitride relative to silicon oxide.

BACKGROUND

Integrated circuits are made possible by processes which produce intricately patterned material layers on substrate surfaces. Producing patterned material on a substrate requires controlled methods for removal of exposed material. Chemical etching is used for a variety of purposes, including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

The fabrication of three-dimensional (3D)-NAND devices includes the formation of alternating silicon oxide (e.g., $SiO_2$) layers and silicon nitride (e.g., $Si_3N_4$) layers. After the formation of the stack of alternating layers, the silicon nitride layers are selectively etched to form recesses that are ultimately filled with a conductor (e.g., tungsten).

Etch processes may be termed "wet" or "dry" based on the materials used in the process. A wet HF etch preferentially removes silicon oxide over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge. There is a need for improved systems and methods that can be used to produce high quality devices and structures.

Currently, a wet etching process is used to selectively remove the silicon nitride layers. However, in the drying process after the wet etching process, the suspended silicon oxide layers may collapse due to surface tension of the liquid. This leads to yield losses. Another issue with wet etching processes is that with future scaling of the 3D-NAND devices, the number of layers of silicon oxide and silicon nitride increases. This is problematic because the liquid etchant will have difficulty filling into a deeper trench. This results in non-uniform etching, such that the etching of the top of the 3D-NAND structure is different than the etching of the bottom of the 3D-NAND structure.

Current dry etching techniques also etch silicon and silicon oxide, in addition to silicon nitride, thereby reducing selectivity of such processes. Accordingly, there is a need for improved etch processes that achieve improved etching selectivity and uniformity and increasing etching rates.

SUMMARY

One or more embodiments of the present disclosure are directed to a selective etch method. The selective etch method comprises flowing a fluorine-containing precursor and a first gas mixture into a semiconductor processing chamber containing a substrate; forming a plasma of the fluorine-containing precursor and the first gas mixture; flowing a sulfur-containing precursor and a second gas mixture into the semiconductor processing chamber, the sulfur-containing precursor and the second gas mixture present in a ratio of sulfur-containing precursor to second gas mixture in a range of from 0.01 to 5; forming a plasma of the sulfur-containing precursor and the second gas mixture; and etching the substrate. The substrate has a plurality of alternating layers of silicon oxide and silicon nitride thereon and a trench formed through the plurality of alternating layers. The silicon nitride layers are selectively etched relative to the silicon oxide layers.

Additional embodiments of the present disclosure are directed to a method of selectively etching silicon nitride relative to silicon oxide. The method comprises flowing a fluorine-containing precursor and a first gas mixture into a semiconductor processing chamber containing a substrate; forming a plasma of the fluorine-containing precursor and the first gas mixture; flowing a sulfur-containing precursor and a second gas mixture into the semiconductor processing chamber, the sulfur-containing precursor and the second gas mixture present in a ratio of sulfur-containing precursor to second gas mixture in a range of from 0.01 to 5; forming a plasma of the sulfur-containing precursor and the second gas mixture; and etching the substrate. The substrate has a plurality of alternating layers of silicon oxide and silicon nitride thereon and a trench formed through the plurality of alternating layers, and the silicon nitride layers are selectively etched relative to the silicon oxide layers at an etch selectivity of greater than or equal to 500:1. In some embodiments, the semiconductor processing chamber is maintained at a pressure in a range of from 5 millitorr to 100 Torr and a temperature of less than or equal to 500° C.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1B:
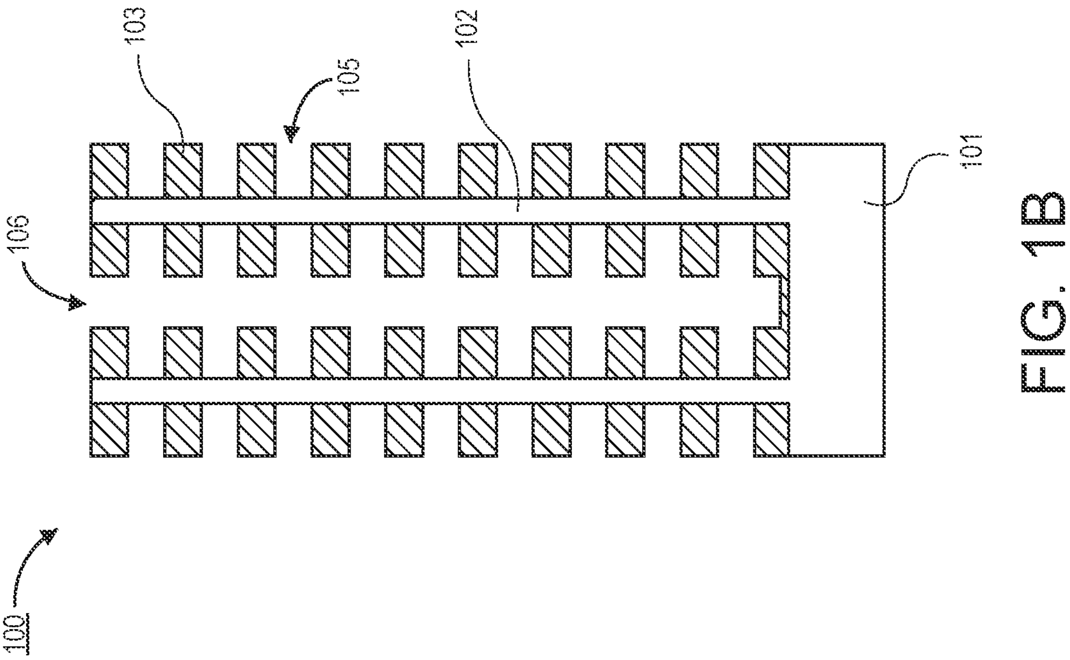
FIG. 1B illustrates a cross-sectional view of a portion of the 3D-NAND structure of FIG. 1A after selectively etching the silicon nitride layers, in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term “substrate” refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A “substrate” (also referred to as a “wafer”) as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor substrates. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term “substrate surface” is intended to include such underlayer as the context indicates. Thus, for example, where a film/layer or partial film/layer has been deposited onto a substrate surface, the exposed surface of the newly deposited film/layer becomes the substrate surface.

As used in this specification and the appended claims, the terms “precursor”, “reactant”, “reactive gas” and the like are used interchangeably to refer to any gaseous species that can react with the substrate surface, or with a film formed on the substrate surface.

In transitioning from 2D-NAND to 3D-NAND, many process operations are modified from vertical to horizontal operations. Additionally, as 3D-NAND structures grow in the number of cells being formed, the aspect ratios of memory holes and other structures increase, sometimes dramatically. During 3D-NAND processing, stacks of placeholder layers and dielectric materials may form the inter electrode dielectric or IPD layers. These placeholder layers may have a variety of operations performed to place structures before fully removing the material and replacing it with metal. While the metallization may be incorporated on one side of the cell structure, operations may have previously been performed on the other side of the structure, such as forming floating gates or charge-trap layers. Although these layers may be formed within the memory hole, cross talk between vertically separated memory cells may occur. One way to reduce this communication includes etching the placeholder material before forming these layers to allow dielectric material to further separate the individual cell material layers from adjacent cells.

The fabrication of 3D-NAND devices includes the formation of alternating silicon oxide layers and silicon nitride layers. After the formation of the stack of alternating layers, the silicon nitride layers are selectively etched to form recesses that are ultimately filled with a conductor (e.g., tungsten).

Currently, a wet etching process is used to selectively remove the silicon nitride layers. However, in the drying process after the wet etching process, the suspended silicon oxide layers may collapse due to surface tension of the liquid. This leads to yield losses. Another issue with wet etching processes is that with future scaling of the 3D-NAND devices, the number of layers of silicon oxide and silicon nitride increases. This is problematic because the liquid etchant will have difficulty filling into a deeper trench. This results in non-uniform etching, such that the etching of the top of the 3D-NAND structure is different than the etching of the bottom of the 3D-NAND structure.

Accordingly, wet etching of 3D-NAND structures remains a challenge, especially as devices continue to scale to include larger stacks of alternating silicon oxide layers and silicon nitride layers. Current dry etching techniques also etch silicon and silicon oxide, in addition to silicon nitride, thereby reducing selectivity of such processes.

Embodiments of the present disclosure advantageously provide improved etch processes including a plurality of chemistries that, when implemented together in a process cycle, achieve improved etching selectivity and uniformity and increasing etching rates.

Embodiments of the disclosure provide an etching chemistry that comprises fluorine (e.g., one or more of sulfur hexafluoride ($SF_6$), nitrogen trifluoride ($NF_3$), carbon tetrafluoride ($CF_4$), silicon tetrafluoride ($SiF_4$), or phosphorous pentafluoride ($PF_5$). In one or more embodiments, the fluorine-containing precursor, (e.g., $SF_6$) is flown into the semiconductor processing chamber with a gas mixture including, for example, an inert gas such as helium (He)). The use of the fluorine-containing precursor and gas mixture constitutes a dry etching process. As such, there is no post-etch drying step that could potentially damage the resulting structures.

Additional embodiments provide a passivating chemistry that comprises sulfur (e.g., one or more of hydrogen sulfide ($H_2S$) or carbon disulfide ($CS_2$). In one or more embodiments, the sulfur-containing precursor, e.g., hydrogen sulfide ($H_2S$), is flown into the semiconductor processing chamber with a gas mixture including, for example, an inert gas such as helium (He)).

Without intending to be bound by any particular theory, it is thought that the etching chemistries (the fluorine-containing precursor and the gas mixture) are aided in their effectiveness by the type of plasma source that is used to implement the etching. Any suitable plasma source can be used to generate a plasma of the fluorine-containing precursor and the first gas mixture and a plasma of the sulfur-containing precursor and the second gas mixture. In one or more embodiments, a remote plasma source, an inductively coupled plasma (ICP) source, a capacitively coupled plasma (CCP) source, or a microwave plasma source may be used to generate the plasma of the fluorine-containing precursor and the first gas mixture and the plasma of the sulfur-containing precursor and the second gas mixture.

The skilled artisan will appreciate that any remote plasma source, inductively coupled plasma (ICP) source, capacitively coupled plasma source (CCP) source, or microwave plasma source that is suitable for generating the plasma of the fluorine-containing precursor and the first gas mixture and the plasma of the sulfur-containing precursor and the second gas mixture may be implemented for the disclosed processes.

One or more embodiments of the present disclosure include modular microwave plasma processing tools for selectively etching silicon nitride relative to silicon oxide. Modular microwave plasma sources have a high plasma density and very low plasma potential (e.g., less than or equal to 10 eV). The high plasma density and low plasma potential results in less sputtering damage to the etched structure as compared to a typical inductively coupled plasma (ICP) source, as an example, which has a higher plasma potential (e.g., greater than or equal to about 20 eV).

It has been found that that in a remote plasma process, the use of $SF_6$ and a gas mixture, such as an inert gas, has an etching rate that is about 80 times lower than an etching rate of an etching process that uses microwave plasma generated from a modular microwave plasma source. As such, it is an unexpected result that the use of $SF_6$ and the gas mixture provides a high etch selectivity dry etching process.

The embodiments of the disclosure are described by way of the Figures, which illustrate devices (e.g., a portion of a 3D-NAND structures) and processes for forming portions of the 3D-NAND structures in accordance with one or more embodiments of the disclosure. The processes shown are merely illustrative possible uses for the disclosed processes, and the skilled artisan will recognize that the disclosed processes are not limited to the illustrated applications.

In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Figure 1A:
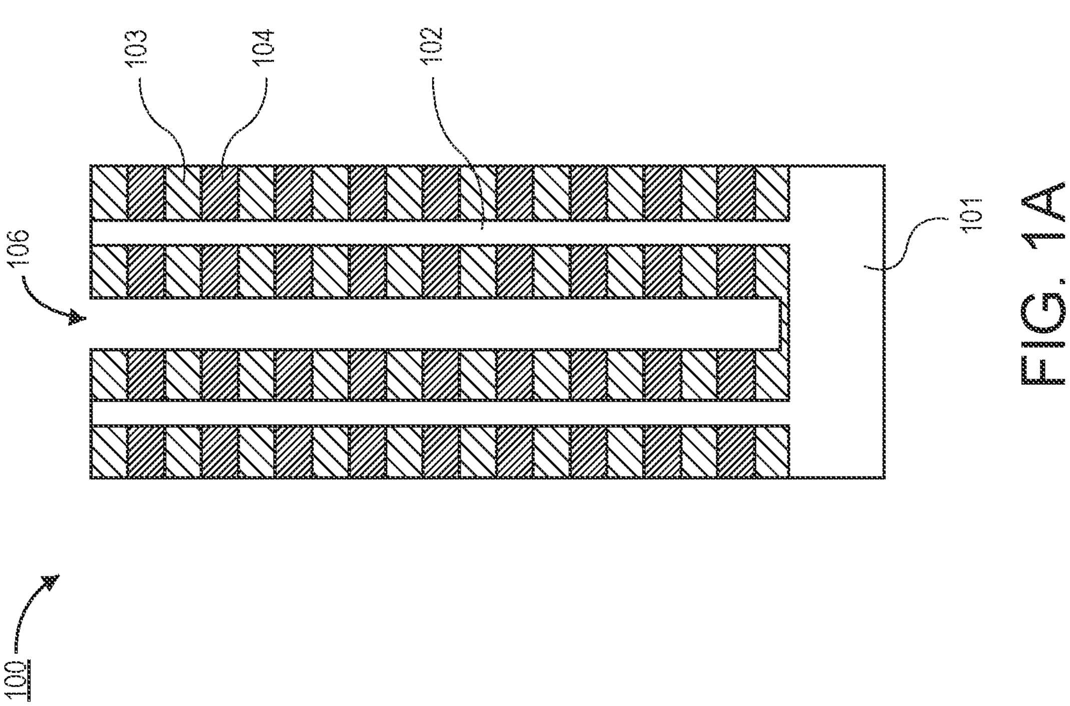
FIG. 1A illustrates a cross-sectional view of a portion of a 3D-NAND structure with alternating silicon oxide layers and silicon nitride layers, in accordance with one or more embodiments of the disclosure.

FIG. 1A illustrates a cross-sectional view of a portion of a 3D-NAND structure with alternating silicon oxide layers and silicon nitride layers. FIG. 1B illustrates a cross-sectional view of a portion of the 3D-NAND structure of FIG. 1A after selectively etching the silicon nitride layers.

In one or more embodiments, the methods described herein are implemented on a 3D structure 100. For example, the 3D structure 100 may be a structure used for a 3D-NAND device. The 3D structure 100 includes a substrate 101, such as a polysilicon substrate, with polysilicon pillars 102 extending up from the substrate 101. In one or more embodiments, each pillar 102 is lined by alternating layers of silicon oxide (e.g., $SiO_x$) 103 and silicon nitride (e.g., $Si_XN_Y$) 104. The sidewalls of the silicon nitride layers 104 and the silicon oxide layers 103 may be exposed by a trench 106 that passes through the layers between the pillars 102.

In some embodiments, the silicon nitride layers 104 are sacrificial layers. In embodiments where the silicon nitride layers 104 are sacrificial layers, the silicon nitride layers 104 are etched away, as shown in FIG. 1B. The removal of the silicon nitride layers 104 results in the formation of recesses 105 between the silicon oxide layers 103. In some embodiments, the recesses 105 are subsequently filled with a conductive layer (not shown) comprising any suitable conductive material known to the skilled artisan, such as tungsten (W).

Advantageously, embodiments of the present disclosure utilize etching chemistries that provide a high etch selectivity of the silicon nitride layers 104 relative to the silicon oxide layers 103. Embodiments of the present disclosure advantageously increase the etching rate of silicon nitride and thereby reduce the time needed to etch the silicon nitride layers 104. Embodiments of the present disclosure include using a plasma source, such as a modular microwave source, to generate a microwave plasma of a fluorine-containing precursor and a gas mixture as an etching chemistry, and using a plasma source, such as a modular microwave source, to generate a microwave plasma of a sulfur-containing precursor and a gas mixture as a passivating chemistry.

In FIGS. 1A and 1B, the structure 100 is shown as being suitable for a 3D-NAND device. The use of the etching processes described herein are particularly beneficial for use in 3D-NAND devices. It has advantageously found that the etching uniformity in highly scaled 3D-NAND devices, such as in structures with high aspect ratios and many silicon nitride layers 104 and silicon oxide layers 103, is substantially uniform at the top of the structure and the bottom of the structure. Additionally, the etching processes of one or more embodiments provides complete removal of the silicon nitride layers 104 without significantly damaging the silicon oxide layers 103. In some embodiments, the sulfur-containing precursor/gas mixture chemistry forms a passivation layer over the exposed portions of the silicon oxide layers 103 to protect the silicon oxide layers 103. As used herein, the sulfur-containing precursor/gas mixture chemistry may be referred to as a "passivation chemistry." In specific embodiments, the etching processes of one or more embodiments provides complete removal of the silicon nitride layers 104 without damaging the silicon oxide layers 103 having the passivation layer thereon.

It will be appreciated by the skilled artisan that embodiments of the present disclosure are not limited to the etching of 3D-NAND structures. For example, similar etching processes may be used wherever a silicon nitride structure needs to be etched selectively to a silicon oxide layer. For example, a silicon nitride layer may be provided over a silicon oxide layer, with the disclosed etching processes etching through the silicon nitride layer and stopping on the oxide layer. In such an embodiment, the silicon oxide layer may be considered an etch stop layer.

While examples of specific semiconductor device architectures that benefit from the use of a plasma source, such as a modular microwave source, to generate a microwave plasma of a fluorine-containing precursor and a gas mixture as an etching chemistry, and a microwave plasma of a sulfur-containing precursor and a gas mixture as a passivating chemistry, are provided, it will be appreciated by the skilled artisan that the provided examples are non-limiting, and there may be many different applications and architectures that benefit from the fluorine-containing precursor/gas mixture etching chemistry and sulfur-containing precursor/gas mixture passivating chemistry in accordance with one or more embodiments herein.

Figure 2:
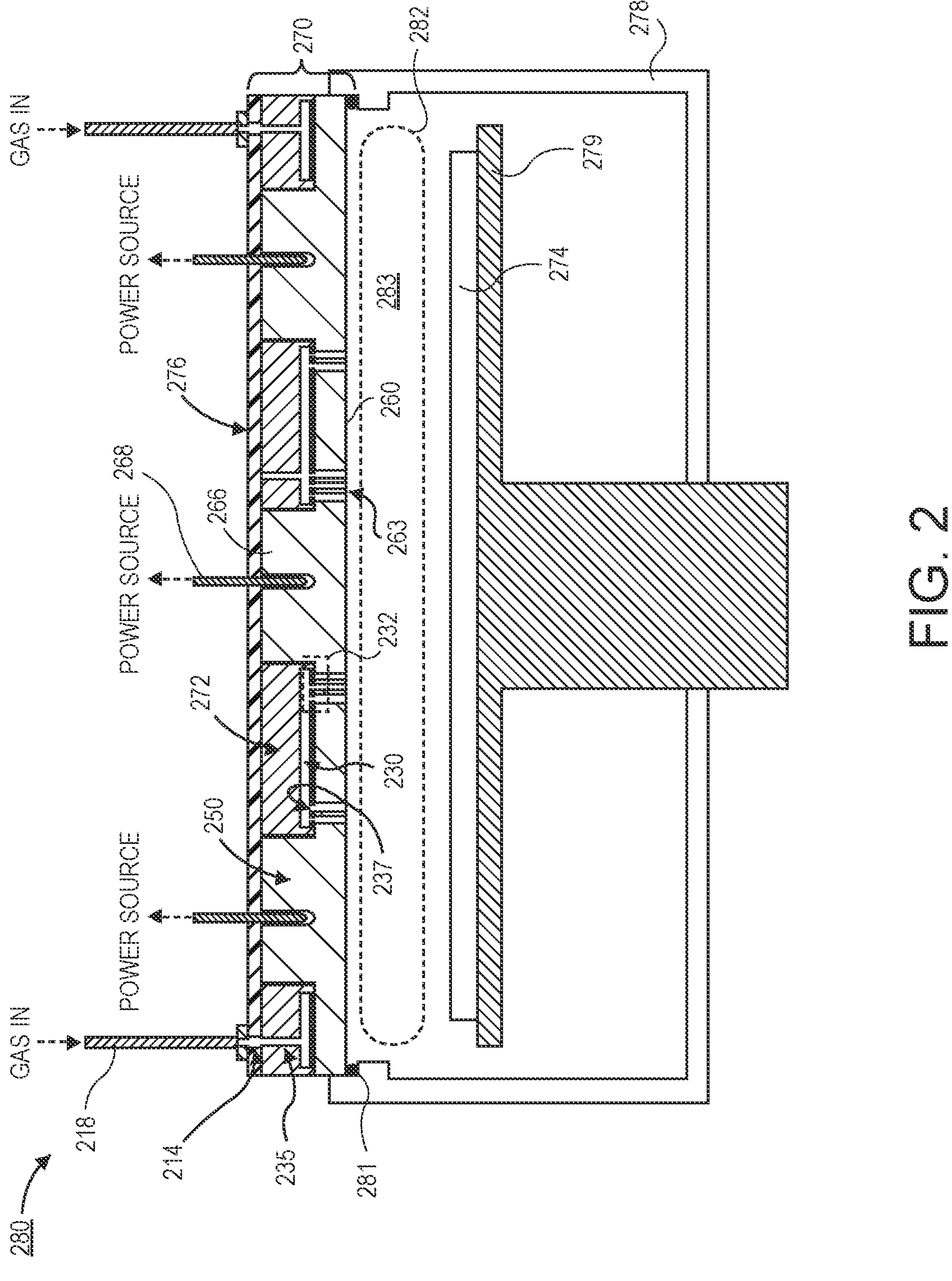
FIG. 2 illustrates a cross-sectional schematic view of a microwave plasma chamber for dry etching a 3D-NAND structure, in accordance with one or more embodiments of the disclosure.

FIG. 2 illustrates a cross-sectional view of a processing tool 280, e.g., a microwave plasma chamber, that includes an assembly 270, in accordance with one or more embodiments of the disclosure.

It will be understood by the skilled artisan that while the disclosure refers to a microwave plasma chamber, any remote plasma source, inductively coupled plasma (ICP) source, capacitively coupled plasma source (CCP) source, or microwave plasma source may be implemented in the disclosed processes.

In some embodiments, the processing tool 280 comprises a processing chamber 278 that is sealed by the assembly 270. For example, the assembly 270 may rest against one or more O-rings 281 to provide a vacuum seal to an interior volume 283 of the processing chamber 278. In other embodiments, the assembly 270 interfaces with the processing chamber 278. Stated differently, in some embodiments, the assembly 270 may be part of a lid that seals the processing chamber 278. In some embodiments, a chuck 279, such as an electrostatic chuck, may support a workpiece 274 (e.g., wafer, substrate, etc.).

In some embodiments, the assembly 270 may comprise a monolithic source array 250, a housing 272, and a lid plate 276. The monolithic source array 250 may comprise a dielectric plate 260 and a plurality of protrusions 266 extending up from the dielectric plate 260. While a monolithic source array 250 is shown, it will be appreciated that the protrusions 266 may be distinct from the dielectric plate 260. The protrusions 266 may be isolated bodies that sit on top of the dielectric plate 260. In some embodiments, there may be five or more protrusions 266, or ten or more protrusions 266. In some embodiments, there are 19 protrusions 266.

The protrusions 266 may include any suitable material known to the skilled artisan. In some embodiments, the protrusions 266 comprise a dielectric material. In some embodiments, the protrusions 266 function as dielectric resonators in order to couple microwaves into the chamber volume 283. In some embodiments, as used herein, the protrusions 266 may be referred to as "applicators," or "plasma applicators," or "microwave applicators."

In some embodiments, the housing 272 includes openings sized to receive the protrusions 266. The housing 272 may be a conductive material. In some embodiments, the housing 272 is grounded. In the illustrated embodiment of FIG. 2, the housing 272 is directly supported by the dielectric plate 260, but it will also be appreciated that a thermal interface material or the like may separate the housing 272 from the dielectric plate 260. In some embodiments, monopole antennas 268 may extend into holes in the protrusions 266. In some embodiments, the holes in the protrusions 266 are larger than the monopole antennas 268 in order to allow for thermal expansion in order to prevent damage to the monolithic source array 250. In some embodiments, the monopole antennas 268 pass through a lid plate 276 over the housing 272 and the protrusions 266. In one or more embodiments, each of the monopole antennas 268 are coupled to different power sources. The skilled artisan will appreciate that the power sources can have any suitable construction.

The chamber volume 283 is suitable for striking a plasma 282. Stated differently, the chamber volume 283 may be a vacuum chamber. In some embodiments, a vacuum source may be fluidically coupled to the chamber volume 283. In order to strike the plasma 282, processing gasses may be flown into the chamber volume 283. The processing gasses may enter the assembly 270 via a gas line 218. The processing gas then passes through a hole 214 through the lid plate 276 and enters a hole 235 in the housing 272. The hole 235 intersects a gas distribution channel 230 that laterally distributes the processing gas. While shown as a plurality of discrete gas distribution channels 230, it will be appreciated by the skilled artisan that the gas distribution channels 230 are fluidically coupled to each other out of the plane of FIG. 2.

The processing gas exits the channel 230 through groups 232 of holes 237 in a cover over the channel 230. The processing gas then passes through gas distribution holes 263 through the dielectric plate 260 of the monolithic source array 250 and enters the chamber volume 283.

Figure 3:
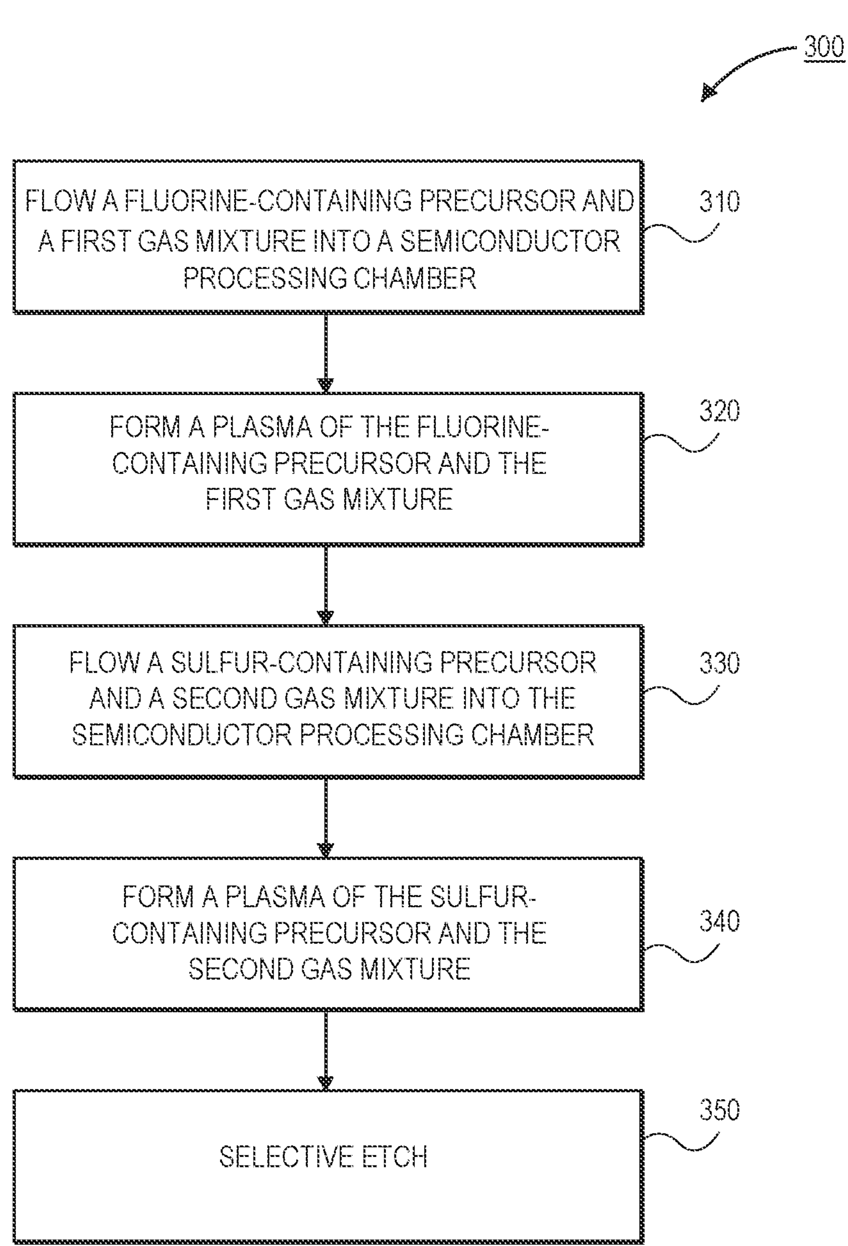
FIG. 3 illustrates a process flow diagram of a method of selectively etching silicon nitride relative to silicon oxide, in accordance with one or more embodiments of the disclosure.

FIG. 3 illustrates a process flow diagram of a method 300 of selectively etching silicon nitride relative to silicon oxide, in accordance with one or more embodiments of the disclosure.

In some embodiments, the method 300 includes a pre-treatment operation (not shown). The pre-treatment can include any suitable pre-treatment process known to the skilled artisan. Suitable pre-treatment processes include, but are not limited to, pre-heating, cleaning, soaking, metal oxidation, or depositing a protective layer to block the bottom of the trench.

In some embodiments, the method 300 is a selective etch method for a 3D structure. The 3D structure may be a 3D-NAND structure, or, more particularly, an intermediate structure used in the fabrication of a 3D-NAND structure. In some embodiments, the 3D structure is the structure described above with respect to FIG. 1A. While a particular 3D structure is described as an example, it will be appreciated by the skilled artisan that any architecture with a silicon nitride layer and an oxide layer may be provided in the processing chamber in accordance with various embodiments.

In some embodiments, the method 300 begins at operation 310, which includes flowing a fluorine-containing precursor and a first gas mixture into a semiconductor processing chamber containing a substrate (operation 310). In one or more embodiments, the etching chemistry consists of the fluorine-containing precursor. In one or more embodiments, the etching chemistry consists of the fluorine-containing precursor and the first gas mixture. In some embodiments, the fluorine-containing precursor comprises one or more of sulfur hexafluoride ($SF_6$), nitrogen trifluoride ($NF_3$), carbon tetrafluoride ($CF_4$), silicon tetrafluoride ($SiF_4$), or phosphorous pentafluoride ($PF_5$). In some embodiments, the fluorine-containing precursor comprises sulfur hexafluoride ($SF_6$).

In some embodiments, the first gas mixture includes one or more of argon (Ar), helium (He), krypton (Kr), neon (Ne), xenon (Xe), hydrogen ($H_2$), oxygen ($O_2$), or nitrogen ($N_2$). In some embodiments, the first gas mixture includes helium (He).

It has been found that argon (Ar) ionizes easily and increases plasma density. It has also been found that helium (He) exhibits reduced oxide damage and improved etch selectivity. In some embodiments, the first gas mixture includes helium (He). In some embodiments, the fluorine-containing precursor and the first gas mixture may be flown into the semiconductor processing chamber at substantially the same time.

In some embodiments, at operation 320, the method 300 includes forming a plasma of the fluorine-containing precursor and the first gas mixture.

In some embodiments, at operation 320, the plasma of the fluorine-containing precursor and the first gas mixture is a remote plasma formed from a remote plasma source, an inductively coupled plasma (ICP) plasma formed from an ICP source, a capacitively coupled plasma (CCP) formed from a CCP source, or a microwave plasma formed from a microwave plasma source. In some embodiments, the plasma is a microwave plasma that is formed by a modular microwave plasma source. The microwave plasma has a high plasma density and very low plasma potential (e.g., less than or equal to 10 eV).

In some embodiments, the semiconductor processing chamber is maintained at a pressure in a range of from 5 millitorr to 100 Torr during striking of the plasma. In some embodiments, the pressure is in a range of from 5 millitorr to 20 Torr, in a range of from 5 millitorr to 10 Torr, or in a range of from 5 millitorr to 5 Torr during striking of the plasma. In some embodiments, the semiconductor processing chamber is maintained at a temperature of less than or equal to 500° C. during striking of the plasma.

In some embodiments, a distance between the plasma source and the substrate with the 3D structure may be less than or equal to 5 inches (12.7 cm), less than or equal to 1 inch (2.54 cm), less than or equal to 0.25 inches (0.635 cm), or less than or equal to 0.1 inches (0.254 cm). In some embodiments, the plasma may be generated from a plurality of plasma applicators, such as the structure shown in FIG. 2.

In some embodiments, the microwave power source provides the microwave plasma at a power of at least 50 Watts per cycle. In some embodiments, the method 300 is repeated, and a plurality of cycles of providing microwave plasma are performed. In some embodiments, the method 300 is repeated until the microwave power source provides a total delivered power of 1500 Watts. In some embodiments, the method 300 is repeated until the microwave power source provides a total delivered power of 2250 Watts. In some embodiments, the method 300 is repeated until the microwave power source a total delivered power of 2850 Watts. In some embodiments, the method 300 is repeated until the microwave power source provides a total delivered power of 5000 Watts. Accordingly, the total delivered power from the microwave power source is in a range of from 50 Watts to 5000 Watts.

In some embodiments, the method 300 includes performing the etching chemistry comprising the plasma of fluorine-containing precursor and the first gas mixture (operations 310 and 320), for a time period in a range of from 5 seconds to 10 minutes. In some embodiments, the method 300 optionally includes purging the semiconductor processing chamber (not shown) of the plasma of the fluorine-containing precursor and the first gas mixture.

As used herein, purging the semiconductor processing chamber removes unreacted precursors, gas mixtures, reaction products, and by-products. For example, in a sector of a spatially separated processing chamber, the portion of the processing chamber adjacent the substrate surface is purged of the unreacted fluorine-containing precursor and/or first gas mixture by any suitable technique including, but not limited to, moving the substrate through a gas curtain to a portion or sector of the processing chamber that contains none or substantially none of the fluorine-containing precursor and/or first gas mixture. In one or more embodiments, purging the processing chamber comprises applying a vacuum. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur.

In one or more embodiments, the purge gas is selected from one or more of nitrogen ($N_2$), helium (He), and argon (Ar). In some embodiments, purging the semiconductor processing chamber includes flowing the purge gas (e.g., helium (He)) over the substrate for a time period in a range of from 0.5 seconds to 10 minutes.

In some embodiments, at operation 330, the method 300 includes flowing a sulfur-containing precursor and a second gas mixture into the semiconductor processing chamber. In one or more embodiments, the passivating chemistry consists of the sulfur-containing precursor. In one or more embodiments, the passivating chemistry consists of the sulfur-containing precursor and the second gas mixture. In some embodiments, the sulfur-containing precursor comprises one or more of hydrogen sulfide ($H_2S$) or carbon disulfide ($CS_2$). In some embodiments, the sulfur-containing precursor comprises hydrogen sulfide ($H_2S$).

In some embodiments, the second gas mixture includes one or more of argon (Ar), helium (He), krypton (Kr), neon (Ne), xenon (Xe), hydrogen ($H_2$), oxygen ($O_2$), or nitrogen ($N_2$). In some embodiments, the second gas mixture includes helium (He).

In some embodiments, the sulfur-containing precursor and the second gas mixture are present in a ratio of sulfur-containing precursor to second gas mixture in a range of from 0.01 to 5. It has advantageously been found that flowing the sulfur-containing precursor and the second gas mixture in the ratio of sulfur-containing precursor to second gas mixture in a range of from 0.01 to 5 increases the etch selectivity of silicon nitride. In some embodiments, when the sulfur-containing precursor and the second gas mixture are flowed in the ratio of sulfur-containing precursor to second gas mixture in a range of from 0.01 to 5, an etching selectivity of silicon nitride to silicon oxide is greater than or equal to 500:1, greater than or equal to 700:1, greater than or equal to 1000:1, greater than or equal to 1200:1, or greater than or equal to 1600:1.

In some embodiments, the ratio of sulfur-containing precursor to second gas mixture is in a range of from 0.01 to 1. In some embodiments, the ratio of sulfur-containing precursor to second gas mixture is in a range of from 0.01 to 0.5. In specific embodiments, the ratio of sulfur-containing precursor to second gas mixture is 0.08.

In some embodiments, at operation 340, the method 300 includes forming a plasma of the sulfur-containing precursor and the second gas mixture.

In some embodiments, at operation 340, the plasma of the sulfur-containing precursor and the second gas mixture is a remote plasma formed from a remote plasma source, an inductively coupled plasma (ICP) plasma formed from an ICP source, a capacitively coupled plasma (CCP) formed from a CCP source, or a microwave plasma formed from a microwave plasma source. In some embodiments, the plasma is a microwave plasma that is formed by a modular microwave plasma source.

In some embodiments, the method 300 includes performing the passivating chemistry comprising the plasma of sulfur-containing precursor and the second gas mixture (operations 330 and 340), for a time period in a range of from 1 seconds to 10 minutes.

In some embodiments, the method 300 optionally includes purging the semiconductor processing chamber (not shown) of the plasma of the sulfur-containing precursor and the second gas mixture. In some embodiments, purging the semiconductor processing chamber includes flowing the purge gas (e.g., helium (He)) over the substrate for a time period in a range of from 0.5 seconds to 10 minutes.

In some embodiments, at operation 350, the method 300 includes selectively etching the substrate. Operation 350 includes providing the plurality of chemistries, such as the etching chemistry and the passivating chemistry described in operations 310-340, that, when implemented together in a process cycle, achieve improved etching selectivity and increased etching rates.

In specific embodiments, a dry etching chemistry that comprises fluorine (e.g., sulfur hexafluoride ($SF_6$)) with a first gas mixture and a passivating chemistry that comprises sulfur (e.g., hydrogen sulfide ($H_2S$)) with a second gas mixture are performed in method 300. It will be understood by the skilled artisan that while the disclosure refers to the fluorine etching chemistry as sulfur hexafluoride ($SF_6$) and the sulfur passivating chemistry as hydrogen sulfide ($H_2S$), the fluorine etching chemistry may include one or more of sulfur hexafluoride ($SF_6$), nitrogen trifluoride ($NF_3$), carbon tetrafluoride ($CF_4$), silicon tetrafluoride ($SiF_4$), or phosphorous pentafluoride ($PF_5$) and the sulfur passivating chemistry may include one or more of hydrogen sulfide ($H_2S$) or carbon disulfide ($CS_2$).

In some embodiments, the $SF_6$/gas mixture etching chemistry (operations 310 and 320) etches the silicon nitride layers 104 relative to the silicon oxide layers 103. In some embodiments, the $H_2S$/gas mixture passivating chemistry (operations 330 and 340) forms a passivation layer over the exposed portions of the silicon oxide layers 103 to protect the silicon oxide layers 103. Stated differently, the $H_2S$/gas mixture passivating chemistry (operations 330 and 340) may be provided without etching the structure. In some embodiments, the $H_2S$/gas mixture passivating chemistry facilitates healing of the etched surfaces. In some embodiments, the $H_2S$/gas mixture passivating chemistry limits, prevents, or regenerates silicon oxide, which may maintain the silicon oxide layers 103 during the $SF_6$/gas mixture etching chemistry.

In some embodiments, such as when the substrate is the substrate 101 shown in FIG. 1A, the substrate 101 has a plurality of alternating layers of silicon oxide 103 and silicon nitride 104 thereon and a trench 106 formed through the plurality of alternating layers. In some embodiments, at operation 350, the silicon nitride layers 104 are selectively etched relative to the silicon oxide layers 103.

It has advantageously found that the etching uniformity in highly scaled 3D-NAND devices, such as in structures with high aspect ratios and many silicon nitride layers 104 and silicon oxide layers 103, is substantially uniform at the top of the structure and the bottom of the structure. Additionally, the etching processes of one or more embodiments provides complete removal of the silicon nitride layers 104 without significantly damaging the silicon oxide layers 103. For example, the etch rate of silicon nitride at a top of a 3D NAND structure may be substantially similar to an etch rate of silicon nitride at a bottom of the 3D NAND structure. In some embodiments, a ratio of the etch rate of silicon nitride between the top of the structure and the bottom of the structure may be between approximately 5:1 and approximately 1:1.

It will be appreciated by the skilled artisan that the etching temperatures (i.e., substrate temperatures) for embodiments disclosed herein may be considered low temperature processes. In some embodiments, the semiconductor processing chamber is maintained at a temperature of less than or equal to 500° C., less than or equal to 400° C., less than or equal to 300° C., less than or equal to 200° C., less than or equal to 100° C., less than or equal to 50° C., less than or equal to 0° C., less than or equal to −50° C., or less than or equal to −100° C. It will be appreciated by the skilled artisan that maintaining the semiconductor chamber at a temperature of less than or equal to 100° C., such as in the range of from less than or equal to 100° C. to less than or equal to −100° C., will require the implementation of additional processing equipment, such as a cryogenic chamber.

In some embodiments, when the sulfur-containing precursor and the second gas mixture are flowed in the ratio of sulfur-containing precursor to second gas mixture in a range of from 0.01 to 5, such as 0.08, an etching selectivity of silicon nitride to silicon oxide is greater than or equal to 500:1, greater than or equal to 700:1, greater than or equal to 1000:1, greater than or equal to 1200:1, or greater than or equal to 1600:1.

It has been advantageously found that the disclosed methods include a plurality of chemistries, such as the etching chemistry and the passivating chemistry described in operations 310-340, that, when implemented together in a process cycle, also achieve an increased etch rate.

For example, using $SF_6$ only as the etching chemistry provides an etch rate of about 8 nm/min for silicon nitride and an etch rate of about 0.06 nm/min for silicon oxide. Using only $SF_6$ as the etching chemistry provides a blanket etch rate of about 130 nm/min. As another example, using $SF_6$ and $H_2$ as the etching chemistry provides an etch rate of about 31 nm/min for silicon nitride and an etch rate of about 0.3 nm/min for silicon oxide. Using $SF_6$ and $H_2$ as the etching chemistry provides a blanket etch rate of about 100 nm/min.

Advantageously, the disclosed methods that include a plurality of chemistries (the $SF_6$/gas mixture etching chemistry and $H_2S$/gas mixture passivating chemistry) provide an etch rate in a range of from 16 nm/min to 80 nm/min for silicon nitride, and an etch rate of about 0.11 nm/min for silicon oxide. The plurality of chemistries of the described methods advantageously provides a blanket etch rate in a range of 170 nm/min to 400 nm/min. Accordingly, the plurality of chemistries achieve an increased etch rate compared to, at least, using only $SF_6$ as the etching chemistry and using $SF_6$ and $H_2$ as the etching chemistry.

While the method 300 is described as including discrete processing operations (operations 310-340) in order to selectively etch the substrate at operation 350, the disclosure is not limited thereto. For example, the method 300 may include any combination of the plurality of chemistries (the $SF_6$/gas mixture etching chemistry and the $H_2S$/gas mixture passivating chemistry).

In one or more embodiments, the $SF_6$/gas mixture etching chemistry and $H_2S$/gas mixture passivating chemistry are provided separately in a ratio. In some embodiments, the $H_2S$/gas mixture passivating chemistry and the $SF_6$/gas mixture etching chemistry are provided in a ratio of $H_2S$/gas mixture to $SF_6$/gas mixture in a range of from 1 to 20. In one or more embodiments, the ratio of $H_2S$/gas mixture to $SF_6$/gas mixture is 2.

In one or more embodiments, the method 300 includes co-flowing $SF_6$ and $H_2S$. In one or more embodiments, the method 300 includes co-flowing $SF_6$ and $H_2S$ in a ratio of $H_2S$/gas mixture to $SF_6$/gas mixture in a range of from 1 to 20. In one or more embodiments, the ratio of $H_2S$/gas mixture to $SF_6$/gas mixture is 2.

One or more embodiments of the disclosure are directed to a non-transitory computer readable medium including instructions, that, when executed by a controller of a processing chamber, cause the processing chamber to perform one or more of the illustrated and unillustrated operations of method 300 as described herein.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A selective etch method comprising:

flowing a fluorine-containing precursor and a first gas mixture into a semiconductor processing chamber containing a substrate;

forming a plasma of the fluorine-containing precursor and the first gas mixture;

flowing a sulfur-containing precursor and a second gas mixture into the semiconductor processing chamber, the sulfur-containing precursor and the second gas mixture present in a ratio of sulfur-containing precursor to second gas mixture in a range of from 0.01 to 5;

forming a plasma of the sulfur-containing precursor and the second gas mixture; and etching the substrate, the substrate having a plurality of alternating layers of silicon oxide and silicon nitride thereon and a trench formed through the plurality of alternating layers, wherein the silicon nitride layers are selectively etched relative to the silicon oxide layers.

2. The method of claim 1, wherein the fluorine-containing precursor comprises one or more of sulfur hexafluoride ($SF_6$), nitrogen trifluoride ($NF_3$), carbon tetrafluoride ($CF_4$), silicon tetrafluoride ($SiF_4$), or phosphorous pentafluoride ($PF_5$).

3. The method of claim 1, wherein the sulfur-containing precursor comprises one or more of hydrogen sulfide ($H_2S$) or carbon disulfide ($CS_2$).

4. The method of claim 1, wherein one or more of the first gas mixture or the second gas mixture includes one or more of argon (Ar), helium (He), krypton (Kr), neon (Ne), xenon (Xe), hydrogen ($H_2$), oxygen ($O_2$), or nitrogen ($N_2$).

5. The method of claim 4, wherein each of the first gas mixture and the second gas mixture comprises helium (He).

6. The method of claim 1, wherein the plasma is generated by a remote plasma source, an inductively coupled plasma (ICP) source, a capacitively coupled plasma (CCP) source, or a microwave plasma source.

7. The method of claim 6, wherein the plasma is a microwave plasma generated by a microwave plasma source.

8. The method of claim 7, wherein the microwave plasma source generates the microwave plasma of one or more of the fluorine-containing precursor and the first gas mixture or the microwave plasma of the sulfur-containing precursor and the second gas mixture at a total delivered power in a range of from 50 Watts to 5000 Watts.

9. The method of claim 1, wherein the ratio of sulfur-containing precursor to second gas mixture is in a range of from 0.01 to 1.

10. The method of claim 1, wherein the ratio of sulfur-containing precursor to second gas mixture is 0.08.

11. The method of claim 1, wherein the sulfur-containing precursor/second gas mixture and the fluorine-containing precursor/first gas mixture are provided in a ratio of sulfur-containing precursor/second gas mixture to fluorine-containing precursor/first gas mixture in a range of from 1 to 20.

12. The method of claim 1, wherein an etching selectivity of silicon nitride to silicon oxide is greater than or equal to 500:1.

13. The method of claim 1, wherein the semiconductor processing chamber is maintained at a pressure in a range of from 5 millitorr to 100 Torr.

14. The method of claim 1, wherein the semiconductor processing chamber is maintained at a temperature of less than or equal to 500° C.

15. The method of claim 1, further comprising purging the semiconductor processing chamber of the plasma of the fluorine-containing precursor and the first gas mixture and/or the plasma of the sulfur-containing precursor and the second gas mixture.

16. A method of selectively etching silicon nitride relative to silicon oxide, the method comprising:

flowing a fluorine-containing precursor and a first gas mixture into a semiconductor processing chamber containing a substrate;

forming a plasma of the fluorine-containing precursor and the first gas mixture;

flowing a sulfur-containing precursor and a second gas mixture into the semiconductor processing chamber, the sulfur-containing precursor and the second gas mixture present in a ratio of sulfur-containing precursor to second gas mixture in a range of from 0.01 to 5;

forming a plasma of the sulfur-containing precursor and the second gas mixture; and etching the substrate, the substrate having a plurality of alternating layers of silicon oxide and silicon nitride thereon and a trench formed through the plurality of alternating layers, and the silicon nitride layers are selectively etched relative to the silicon oxide layers at an etch selectivity of greater than or equal to 500:1, wherein the semiconductor processing chamber is maintained at a pressure in a range of from 5 millitorr to 100 Torr and a temperature of less than or equal to 500° C.

17. The method of claim 16, wherein the fluorine-containing precursor comprises one or more of sulfur hexafluoride ($SF_6$), nitrogen trifluoride ($NF_3$), carbon tetrafluoride ($CF_4$), silicon tetrafluoride ($SiF_4$), or phosphorous pentafluoride ($PF_5$) and the sulfur-containing precursor comprises one or more of hydrogen sulfide ($H_2S$) or carbon disulfide ($CS_2$).

18. The method of claim 16, wherein each of the first gas mixture and the second gas mixture comprises helium (He).

19. The method of claim 16, wherein the plasma is generated by a remote plasma source, an inductively coupled plasma (ICP) source, a capacitively coupled plasma (CCP) source, or a microwave plasma source.

20. The method of claim 16, wherein the ratio of sulfur-containing precursor to second gas mixture is 0.08.

* * * * *